United States Patent
Fukuoka et al.

(10) Patent No.: US 8,025,925 B2
(45) Date of Patent: Sep. 27, 2011

(54) HEATING APPARATUS, COATING AND DEVELOPMENT APPARATUS, AND HEATING METHOD

(75) Inventors: Tetsuo Fukuoka, Koshi (JP); Takahiro Kitano, Koshi (JP); Nobuaki Matsuoka, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1076 days.

(21) Appl. No.: 11/378,319

(22) Filed: Mar. 20, 2006

(65) Prior Publication Data
US 2006/0216665 A1 Sep. 28, 2006

(30) Foreign Application Priority Data
Mar. 25, 2005 (JP) .................. 2005-088447

(51) Int. Cl.
*B05D 3/02* (2006.01)
*H05B 3/68* (2006.01)
*C23C 16/00* (2006.01)
(52) U.S. Cl. .......... 427/372.2; 219/443.1; 118/724
(58) Field of Classification Search .......... 219/443.1, 219/444.1; 118/724, 725; 427/372.2
See application file for complete search history.

(56) References Cited

U.S. PATENT DOCUMENTS

| | | | | |
|---|---|---|---|---|
| 4,615,755 A | * | 10/1986 | Tracy et al. | 156/345.53 |
| 5,803,977 A | * | 9/1998 | Tepman et al. | 118/728 |
| 6,072,162 A | * | 6/2000 | Ito et al. | 219/444.1 |
| 6,129,546 A | * | 10/2000 | Sada | 432/253 |
| 6,185,370 B1 | * | 2/2001 | Sekimoto et al. | 392/386 |
| 6,399,926 B2 | * | 6/2002 | Takano et al. | 219/497 |
| 6,518,548 B2 | * | 2/2003 | Sugaya et al. | 219/444.1 |
| 7,094,994 B2 | * | 8/2006 | Oyama et al. | 219/444.1 |
| 2005/0173410 A1 | * | 8/2005 | Okajima et al. | 219/538 |

FOREIGN PATENT DOCUMENTS

| | | |
|---|---|---|
| JP | 6-91216 | 4/1994 |
| JP | 2001-237156 | 8/2001 |
| JP | 2001-274052 | 10/2001 |
| JP | 2004-293942 | 10/2004 |

OTHER PUBLICATIONS

Japanese Office Action issued on Aug. 4, 2009 for Japanese Patent Application No. 2005-088447 with English translation.

* cited by examiner

*Primary Examiner* — Sang Paik
(74) *Attorney, Agent, or Firm* — Smith, Gambrell & Russell, LLP

(57) ABSTRACT

A heating apparatus is configured to include a hot plate at which a substrate is placed, a top plate opposed to the substrate, a gas discharging part provided on one end side of the hot plate for discharging gas between the hot plate and the top plate, an exhaust part provided to be opposed to the gas discharging part with the hot plate interposed therebetween, and a heating part independently heating a first region and a second region of the substrate. A heating process is performed with good within-wafer uniformity by forming an unidirectional flow to heat the first region and the second region at different temperatures.

7 Claims, 13 Drawing Sheets

HEATING APPARATUS, COATING AND DEVELOPMENT APPARATUS, AND HEATING METHOD

BACKGROUND OF THE INVENTION

1. Field of the Invention

The present invention relates to a heating apparatus performing a heating process on a substrate coated with a coating liquid, a coating and development apparatus including the heating apparatus, and a heating method.

2. Description of the Background Art

An apparatus for forming a resist pattern on a glass plate for a semiconductor wafer (referred to as a wafer hereinafter) and an LCD (Liquid Crystal Display) includes a coating and development apparatus applying a resist on a wafer and developing the exposed wafer. This apparatus is equipped with a heating apparatus called a baking apparatus or the like. An apparatus that heats a wafer coated with a resist liquid, for example, serves to dry a solvent in the resist liquid.

Such a heating apparatus generally includes a hot plate 11, over which a cover body 12 lies, as shown in FIG. 13. While gas is supplied to the inside of cover body 12 from a gas supply port 13 formed around the entire circumference of a wafer W1, the gas is sucked and exhausted from the central portion of the cover body 12. In this manner, a heating process is performed while a gas flow from the outer circumference of the wafer toward the center is formed, as represented by the arrow in the figure. However, when a gas flow is formed in this manner, sublimation substances subliming from the resist liquid is likely to attach to the wafer as particles even with a uniform temperature within the surface of hot plate 11, for which reason is not clarified, though.

On the other hand, Japanese Patent Laying-Open No. 2004-293924 discloses a heating apparatus performing dry processing on a glass substrate for LCD coated with a polyimide solution for an alignment film, in which a passage of a gas flow is formed by placing a cover over a region above a hot plate. A heating process is performed while a gas flow from an opening on one side of the passage toward the other side is formed. The inventor understands that the amount of the attached sublimation substances on the wafer is reduced when the technique of forming a gas flow from one end side to the other end side, so to speak, a unidirectional flow is applied to the wafer heating apparatus, as compared with when a gas flow is formed from the outer circumference to the center of the wafer. In this case, however, the velocity of flow is high at the other end side of a wafer from which a gas flow is exhausted. Therefore, the heating process may not be uniform, so that the resist film may lack uniformity.

In addition, such a heating apparatus has also the following problem. The particles on the heating plate is transferred to the wafer when the wafer is brought into surface contact with the heating plate. Thus, a plurality of protrusion portions each having a height of 0.1 mm are usually provided on the heating plate, so that the wafer placed thereon is slightly isolated from the heating surface (Japanese Patent Laying-Open No. 2001-274052). This height is set at a minimum value such that the wafer does not contact with the heating surface. With a larger value, it is difficult to keep the wafer-heating temperature uniform.

Now, with the increased wafer size in diameter, a semiconductor manufacturing apparatus for a 12-inch wafer (a diameter of 30 mm) is put into practice, and a wafer with a even larger diameter has been developed. However, with the 12-inch or larger size, some wafers may badly warp. Accordingly, with a height of 0.1 mm of a protrusion provided on the heating plate, the wafer may come into contact with the hot plate and become misaligned. Moreover, when the wafer is delivered onto the hot plate (the protrusion portion), the wafer may slide sideways as if it is placed on an ice face. This phenomena takes place since an air layer is presumably formed in such a manner that the air is enclosed and slightly pressurized in a small space under a large-diameter wafer.

SUMMARY OF THE INVENTION

An object of the present invention is to provide a heating apparatus and a heating method, in which attachment of particles to a substrate is prevented and in addition, a heating process is performed with good within-wafer uniformity when a substrate coated with a coating liquid is heated. Another object of the present invention is to provide a heating apparatus and a heating method with good within-wafer uniformity, in which contact of a warped substrate with a hot plate can be prevented even with a larger substrate size.

In accordance with the present invention, a heating apparatus performing a heating process for a coating liquid coated on a substrate includes: a hot plate at which the substrate is placed; a top plate for rectification provided above the hot plate to be opposed to the substrate; a gas discharging part provided on one end side of the hot plate for discharging gas between the hot plate and the top plate to form a gas flow having a width that can cover a width of the substrate; an exhaust part provided on a side opposed to the gas discharging part with the hot plate interposed to suck and exhaust the gas; and a heating part provided at the hot plate and being capable of independently heating a first region at an exhaust part side in the substrate and a second region other than the first region and heating the first region at a temperature higher than the second region. The gas flow from the gas discharging part flows from one end side to the other end side of the substrate.

Preferably, a protrusion portion having a height of 0.3 mm to 1.0 mm is provided on the hot plate for supporting the substrate in such a manner that the substrate is isolated from a surface of the hot plate. The gas discharged from the gas discharging part is heated at a temperature within ±2% with respect to a heating temperature for the substrate. The "heating temperature for the substrate" refers to a temperature of the substrate during a heating process for the substrate.

In accordance with another aspect of the present invention, a heating apparatus performing a heating process for a coating liquid coated on a substrate includes: a hot plate at which the substrate is placed; a top plate for rectification provided above the hot plate to be opposed to the substrate; a gas discharging part provided on one end side of the hot plate for discharging gas between the hot plate and the top plate to form a gas flow having a width that can cover a width of the substrate; an exhaust part provided on a side opposed to the gas discharging part with the hot plate interposed to suck and exhaust the gas; a heating part provided at the top plate and being capable of independently heating a region opposed to a first region on an exhaust part side in the substrate and a region opposed to a second region other than the first region and heating the region opposed to the first region at a temperature higher than the region opposed to the second region. The gas flow from the gas discharging part flows from one end side to the other end side of the substrate.

In accordance with another aspect of the present invention, a heating apparatus performing a heating process for a coating liquid coated on a substrate includes: a hot plate at which the substrate is placed; a protrusion portion having a height of 0.3 mm to 1.0 mm provided at the hot plate for supporting the substrate in such a manner that the substrate is isolated from a surface of the hot plate; a top plate for rectification provided above the hot plate to be opposed to the substrate; a gas discharging part provided on one end side of the hot plate for discharging gas heated to a temperature within ±2% with respect to a heating temperature for the substrate between the hot plate and the top plate to form a gas flow having a width that can cover a width of the substrate; and an exhaust part provided on a side opposed to the gas discharging part with the hot plate interposed to suck and exhaust the gas. The gas flow from the gas discharging part flows from one end side to the other end side of the substrate. Here, the substrate referred to herein is a semiconductor wafer having a size of 12 inches or larger. The top plate is provided with another heating part for heating an undersurface of the top plate.

In accordance with the present invention, a coating and development apparatus includes: a carrier block into which a carrier accommodating a substrate is carried; a process block including a coating part coating a resist on a surface of the substrate removed from the carrier, a heating apparatus heating the substrate coated with a resist, a cooling part cooling the heated substrate, and a development processing part developing the substrate after exposure; and an interface part delivering the substrate between the process block and an exposure apparatus. The heating apparatus as described above is used in the coating and development apparatus.

In accordance with the present invention, a heating method of performing a heating process for a coating liquid coated on a substrate includes the steps of: placing the substrate at a hot plate; discharging gas from a gas discharging part on one end side of the hot plate while sucking and exhausting gas from an exhaust part on the other end side of the hot plate thereby forming a gas flow having a width that can cover a width of the substrate, from the one end side to the other end side of the hot plate between the substrate and a top plate for rectification as opposed to the substrate; and using a heating part provided at the hot plate, independently controlling heating a predetermined first region on an exhaust part side in the substrate and a second region other than the first region, and heating the first region at a temperature higher than the second region.

In accordance with another aspect, a heating method of performing a heating process for a coating liquid coated on a substrate includes the steps of: placing the substrate at a hot plate; discharging gas from a gas discharging part on one end side of the hot plate while sucking and exhausting gas from an exhaust part on the other end side of the hot plate thereby forming a gas flow having a width that can cover a width of the substrate, from the one end side to the other end side of the hot plate between the substrate and a top plate for rectification as opposed to the substrate; and using a heating part provided at the top plate, independently controlling heating a region opposed to a predetermined first region on an exhaust part side in the substrate and a region opposed to a second region other than the first region, and heating the region opposed to the first region at a temperature higher than the region opposed to the second region.

In accordance with another aspect, a heating method of performing a heating process for a coating liquid coated on a substrate includes the steps of: placing the substrate in such a manner that the substrate is supported by a protrusion portion having a height of 0.3 mm to 1.0 mm provided on a surface of a hot plate and is isolated from the hot plate; and discharging gas heated to a temperature within ±2% with respect to a heating temperature for the substrate from a gas discharging part on one end side of the hot plate while sucking and exhausting gas from an exhaust part on the other end side of the hot plate, thereby forming a gas flow having a width that can cover a width of the substrate, from the one end side to the other end side of the hot plate between the substrate and a top plate for rectification as opposed to the substrate. In those heating methods, a heating process is performed on a substrate while the undersurface of the top plate is heated, for example, by another heating part provided at the top plate.

In accordance with the present invention, when a substrate coated with a coating liquid is placed on a hot plate for heating, a gas flow from one end side to the other end side of the substrate is formed during a heating process. Therefore, gas staying around the substrate is reduced and variations in the velocity of flow on the surface of the substrate are reduced, so that sublimation substances from the coating liquid is effectively exhausted from above the substrate. Accordingly, attachment of particles to the substrate can be reduced. When a so-called unidirectional gas flow is formed in this way, the velocity at the other end part of the substrate that is the exhaust part side of the gas flow tends to increase. However, the first region that is the other end part and the second region other than the first region are controlled to be independently heated, so that the temperature at the first region is higher than the temperature at the second region. Therefore, a heating process can be performed with good within-wafer uniformity.

In accordance with another aspect of the present invention, a top plate opposed to a substrate is heated by the heating part provided at the top plate such that a temperature at a region opposed to the first region is higher than a temperature at a region opposed to the second region other than the first region. Therefore, a heating process can be performed with good within-wafer uniformity.

In accordance with yet another aspect of the present invention, a height of a protrusion portion on which a substrate is placed isolated from a hot plate is set at 0.3 mm to 1.0 mm. Therefore, even with a large size substrate, for example, a wafer of 12 inches or larger, contact of the warped substrate with the hot plate can be prevented thereby preventing misalignment. In addition, gas having approximately the same temperature as the substrate heating temperature is discharged between the hot plate and the top plate, so that a heating process can be performed with good within-wafer uniformity.

Provision of the heating apparatus as described above for a coating and development apparatus results in a good resist pattern.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
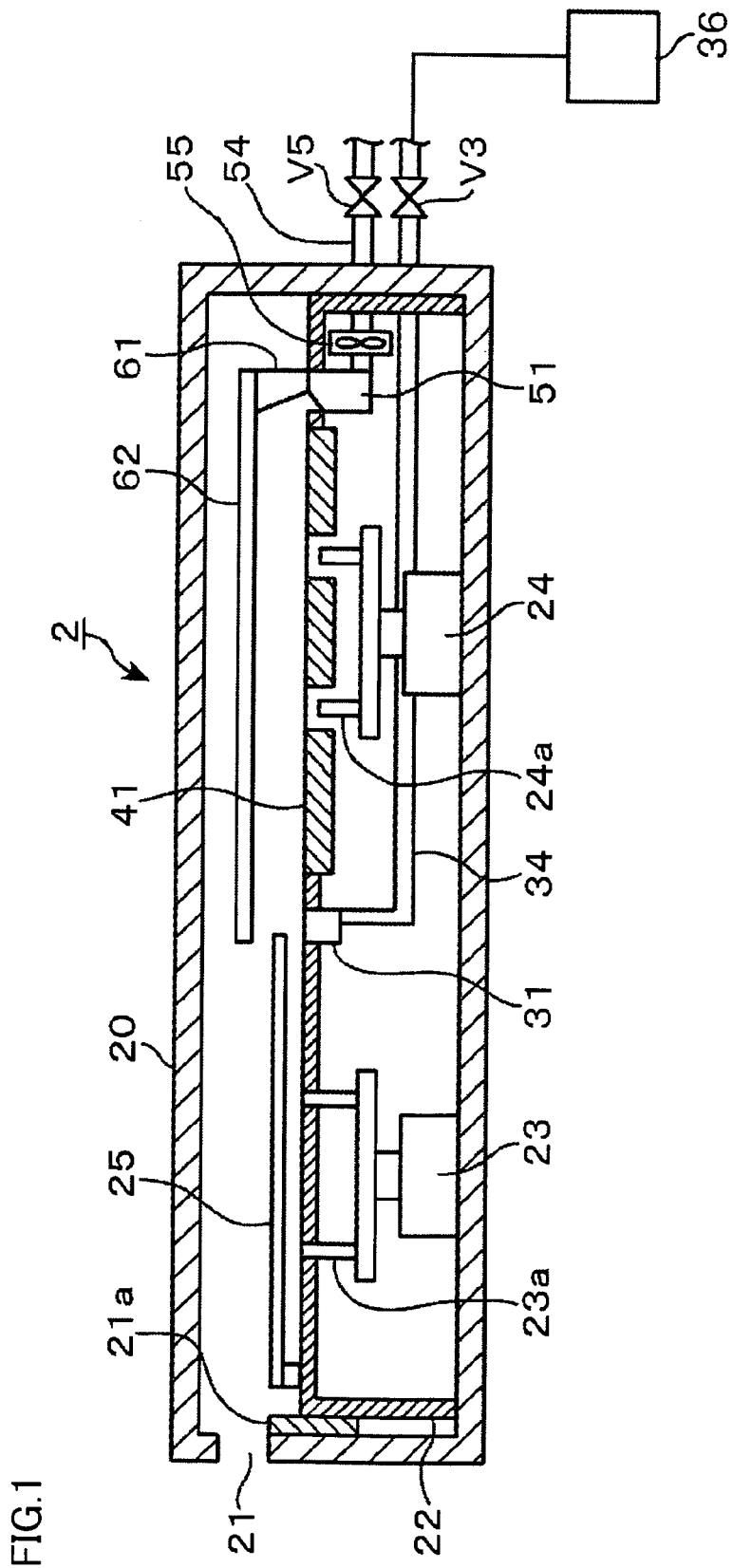
FIG. 1 is a longitudinal sectional side view showing an exemplary embodiment of a heating apparatus in accordance with the present invention.
Figure 2A:
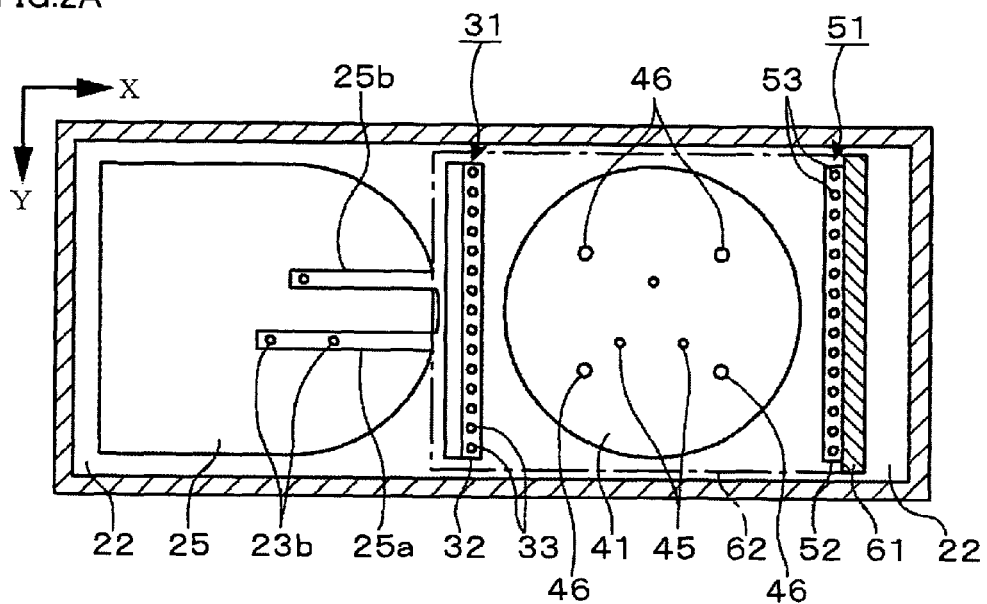
FIGS. 2A and 2B are cross sectional plan views of the heating apparatus.
Figure 2B:
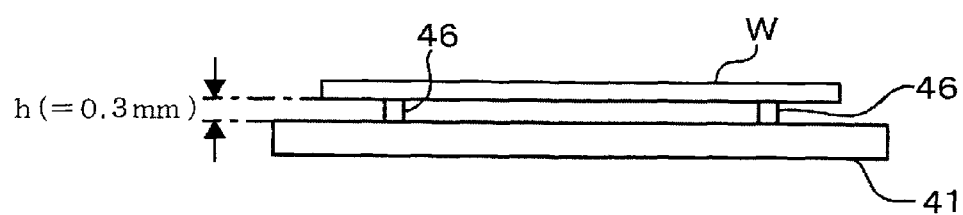
Figure 3:
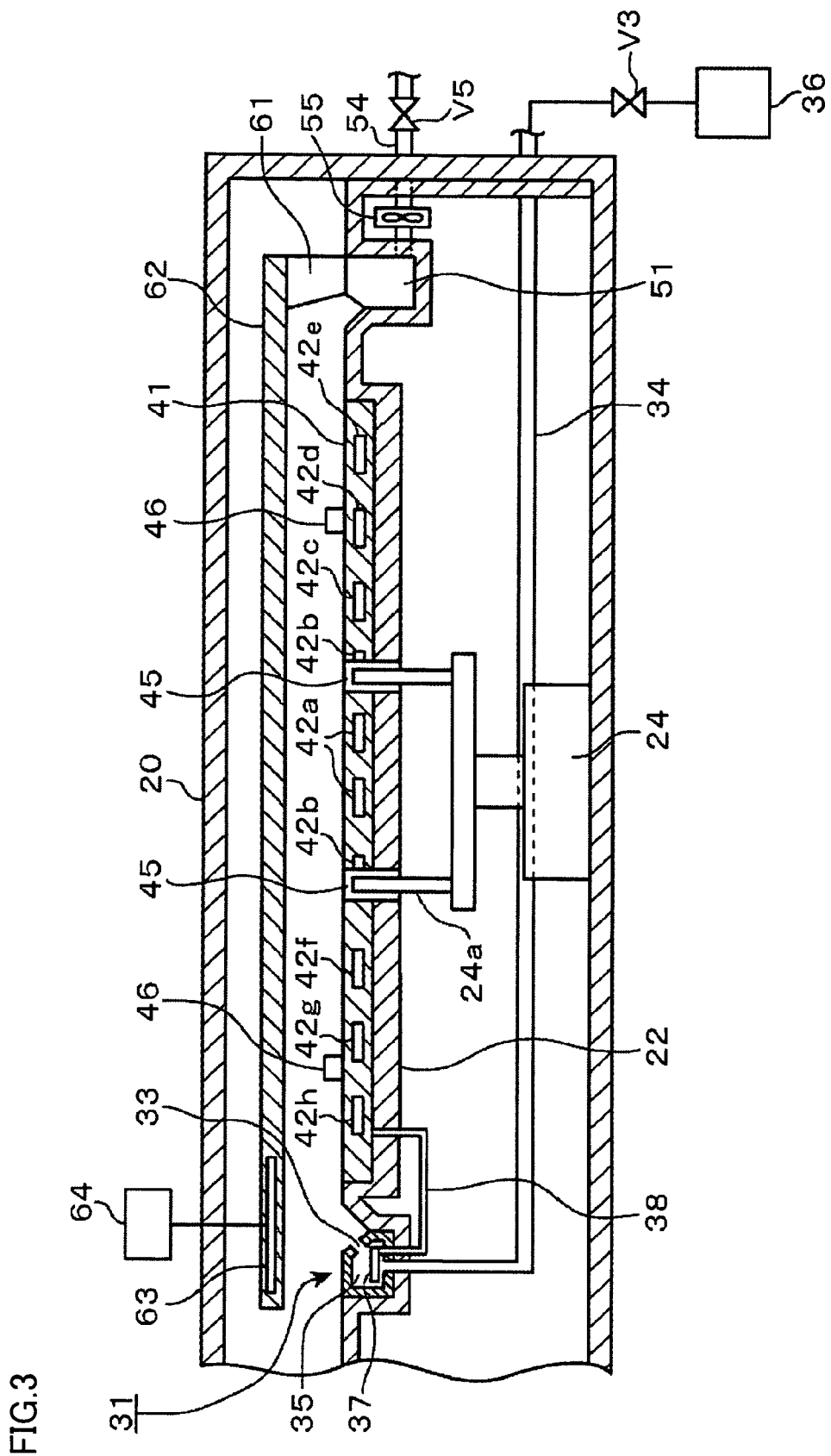
FIG. 3 is a longitudinal sectional side view of a main part of the heating apparatus.

In the following, a heating apparatus in accordance with an exemplary embodiment of the present invention will be described with reference to FIGS. 1-3. A heating apparatus 2 performs a heating process on a semiconductor wafer (abbreviated as a wafer hereinafter) W as a substrate having its surface coated with a resist liquid, for example, as a coating liquid, thereby forming a resist film on the surface of the wafer W. It is noted that the size of the wafer W is, for example, 12 inches or larger. The heating apparatus 2 includes a housing 20 having a side wall provided with a transfer port 21 for wafer W. The transfer port 21 is freely opened and closed by means of a shutter 21a. This shutter 21a is provided to prevent disorder of a gas flow as described later, which may be formed around wafer W by the outside gas flowing into housing 20 through transfer port 21 during heating of wafer W. In place of shutter 21a, for example, an air curtain may be provided in the vicinity of transfer port 21 to prevent the inflow of the outside air.

A base 22 is also provided at the lower part of housing 20. Inside the base 22, elevator mechanisms 23, 24 are provided in this order from the near side to the far side as viewed from transfer port 21. For example, three supporting pins 23a are connected to elevator mechanism 23. The supporting pin 23a is formed such that elevator mechanism 23 allows support pin 23a to vertically project above base 22 through a hole 23b bored through base 22. Elevator mechanism 24 will be described later.

A cooling plate 25 is provided above base 22 on the near side. The cooling plate 25 includes a cooling flow path (not shown) on the backside thereof for feeding a temperature adjusting water, so that wafer W placed on cooling plate 25 is roughly cooled. It is noted that such a cooling mechanism is provided assuming that heating apparatus 2 is incorporated in an apparatus such as a coating and development apparatus. Alternatively, the cooling mechanism may not be provided.

The cooling plate 25 is formed to deliver wafer W carried into housing 20 through transfer port 21 from/to a wafer W transferring mechanism (not shown) including an arm body supporting, for example, the back surface of a wafer with the supporting pin 23a. The cooling plate 25 also serves to deliver wafer W between the wafer W transferring mechanism and a hot plate 41 and is formed to freely move forward and backward between the near side and the far side on base 22 along guide means (not shown) provided at base 22. The figure shows slits 25a, 25b through which the supporting pins 23a, 24a pass.

On base 22, toward the side farther from cooling plate 25, a gas discharging part 31, a hot plate 41, and an exhaust part 51 are provided in this order. The gas discharging part 31 and the exhaust part 51 are provided to cover the diameter (width) of wafer W placed on hot plate 41 together with a top plate 62 described later such that a gas flow, so to speak, a unidirectional flow is formed that flows from the near side to the far side, that is, from the one end side to the other end side of wafer W between top plate 51 and hot plate 41.

Gas discharging part 31 will now be described, first. Gas discharging part 31 includes a slope portion 32 facing to the upper far side of housing 20. The slope portion 32 is provided, for example, with a number of small holes as discharging ports 33 at certain intervals along the width direction (the Y direction in the figure) of housing 20. The length from one end to the other end of the discharging ports 33 is formed to cover the diameter of wafer W placed on hot plate 41. A gas supply pipe 34 is connected to gas discharging part 31. The gas supply pipe 34 is in communication with the discharging port 33 through a space 35 provided in gas discharging part 31. The gas supply pipe 34 also extends, for example, to the outside of housing 20 and has its end connected to a gas supply source 36 storing a clean purging gas, for example, an inert gas such as nitrogen gas. The space 35 is provided with a heat transfer plate 37, for example, along the width direction. The heat transfer plate 37 is connected to the one end of each of a plurality of heat pipes 38 provided at intervals, for example, along the width direction. The other end of each heat pipe 38 is connected to hot plate 41, so that when the purging gas supplied from gas supply source 36 into gas supply pipe 34 flows into space 35 of gas discharging part 31, the gas is adjusted to have the same temperature as the wafer W heating temperature (the surface temperature of wafer W during heating) by means of heat transfer plate 37 and is then discharged from discharging port 33. The purging gas is subjected to pressure loss as being stored in space 35 and is then discharged from discharging port 33 toward the undersurface of top plate 62 described later with uniform flow rate and pressure.

The means for heating the purging gas may be a heater provided, for example, in the vicinity of the exit of gas supply pipe 34. Wafer W is supported in such a manner as to be isolated from hot plate 41, for example, by 0.3 mm. Although heat transfer from hot plate 41 to wafer W becomes poor, the heated purging gas flows along the surface of wafer W so that wafer W can be heated at a preset process temperature.

Figure 4:
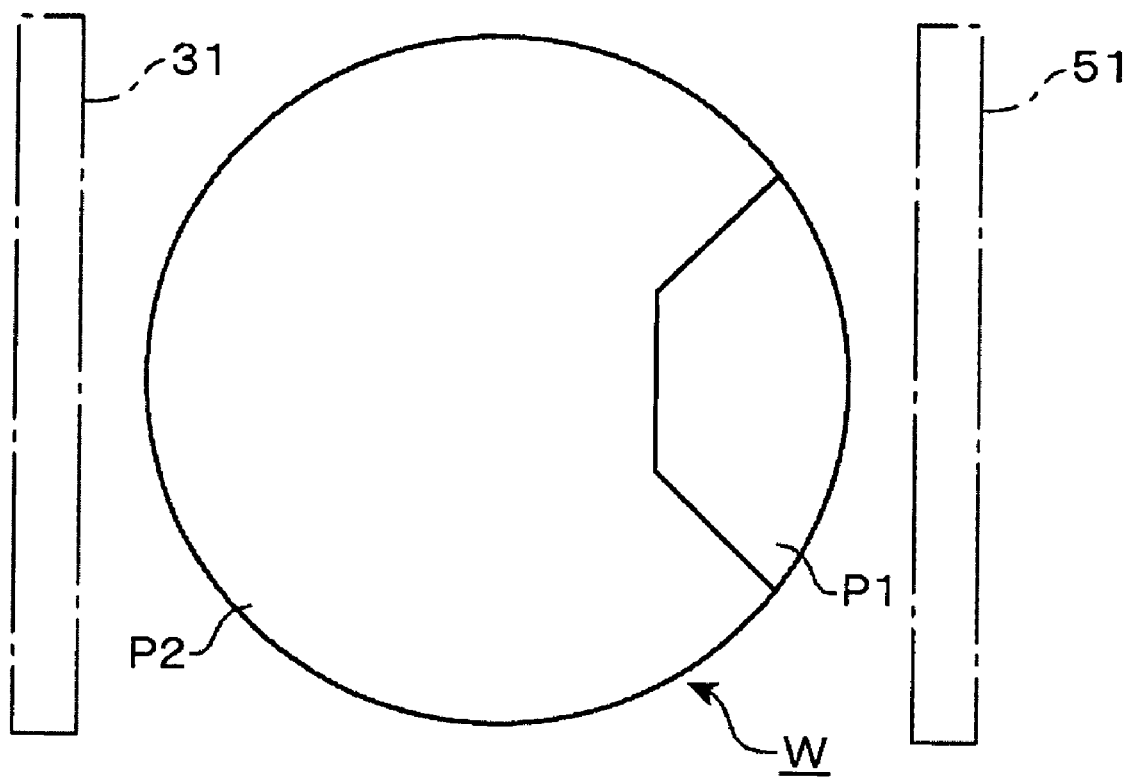
FIG. 4 is an illustration showing a region of a wafer heated by the heating apparatus.
Figure 5A:
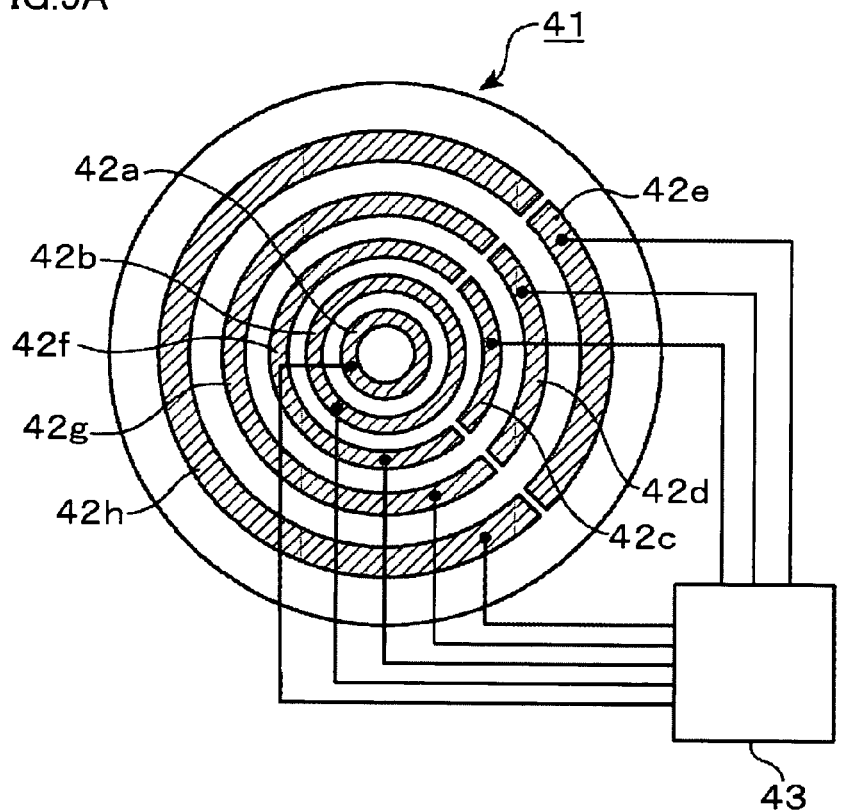
FIG. 5A is an illustration of a hot plate forming the heating apparatus.

Hot plate 41 will now be described. The hot plate 41 has a dimension that covers the entire surface of wafer W and is shaped, for example, like a disk. Here, FIG. 4 shows the surface of wafer W placed on hot plate 41, in which, assuming the right side in the figure as the exhaust part 51 side (the far side), wafer W includes a first region P1 that is an approximate sector-shaped region in FIG. 4 on the exhaust part 51 side and a second region P2 other than the first region P1. In this example, the first region P1 is an approximate sector-shaped region extending in the form of a sector from the center of wafer W to the circumference of wafer W at a position closer to the exhaust part 51 side. As is clear from the evaluation test as described later, when the unidirectional flow is formed during heating of wafer W, the velocity of flow of the unidirectional flow at the periphery of the first region P1 is greater than the velocity of flow at the periphery of the second region P2. Therefore, it is likely that the heat escapes and the temperature is reduced in the first region P1 as compared with the second region P2. In order to compensate for the temperature, for example, heaters 42a-42h as heating means are provided inside hot plate 41, as shown in FIG. 5A.

More specifically, ring-shaped heaters 42a, 42b having different diameters are concentrically arranged at the central portion of hot plate 41 such that they are positioned under the second region P2 when wafer W is placed on hot plate 41. For example, sector-shaped heaters 42c-42e are provided at intervals in order extending from the heater 42b toward the exhaust port 51 side such that they are positioned under the first region P1. For example, sector-shaped heaters 42f-42h are also provided at intervals extending toward the gas discharging port 31 side from heater 42b such that they are positioned under the second region P2. Each of heaters 42a-42h are connected to a power supply unit 43. A control unit included in the heating apparatus 2 described later controls the individual heating value of each heater 42a-42h through the power supply unit 43, so that the first region P1 of wafer W can be heated at a temperature higher than the second region P2. In other words, an offset is applied to the region P1.

It is noted that in the present invention the division number (the installation number), shape, and layout of the heaters in hot plate 41 are not limited to the example as described above, as long as the first region P1 of wafer W is heated at a temperature higher than the second region P2.

Returning to FIGS. 1-3, a hole 45 vertically passes through hot plate 41 and base 22 supporting the bottom portion of the hot plate 41. The elevator mechanism 24 is provided below the hot plate 41, and three supporting pins 24a are connected to the elevator mechanism 24. The elevator mechanism 24 causes the supporting pin 24a to protrude above hot plate 41 through the hole 45 so that wafer W can be delivered between the cooling plate 25 and the supporting pin 24a. For example, four protrusion portions 46 supporting the back surface of wafer W are provided on the surface of hot plate 41 along the circumferential direction of hot plate 41. When supporting pin 24a goes down with the back surface of wafer W supported, wafer W is delivered onto the protrusion portion 46. The height of protrusion portion 46 is preferably 0.3 mm to 1.0 mm and is set at 0.3 mm in this example. With the height lower than 0.3 mm, wafer W of 12 inches or larger, in particular, may come into contact with hot plate 41 to be misaligned, if wafer W is warped. With the height higher than 1.0 mm, on the other hand, the heat from hot plate 41 may not be transmitted sufficiently to the wafer W, so that it becomes difficult to keep the temperature with good within-wafer uniformity.

The exhaust part 51 is provided to be opposed to the gas discharging part 31 with the hot plate 41 interposed therebetween and includes a slope portion 52 facing to the upper near side of housing 20. The slope portion 52 is provided with, for example, a number of small holes as exhaust ports 53 at regular intervals along the width direction of housing 20. The length from one end to the other end of the exhaust ports 53 is formed to cover, for example, the diameter of wafer W. An exhaust pipe 54 is connected to the exhaust, part 51. The exhaust pipe 54 is in communication with the exhaust port 53 through a passage provided inside exhaust part 51. Exhaust pipe 54 extends to the outside of housing 20 and has its end portion connected, for example, to an exhaust path of a factory. A fan 55 is also installed across the exhaust pipe. Exhaust part 51 is formed to exhaust the gas in housing 20 from exhaust port 53 through exhaust pipe 54, for example, at the preset amount of exhaustion by controlling the number of revolutions of the fan 55. It is noted that in the figures V5 represents a valve installed across exhaust pipe 54.

Here, the gas discharging part 31 and the exhaust part 51 may not be limited to the configuration of this embodiment as long as the unidirectional flow can be formed by the gas discharging part 31 and the exhaust part 51. The shapes of discharging port 33 and exhaust port 53 are not limited to those in this example and may be formed like slits along the width direction.

A support 61 is provided on the upper part of exhaust part 51. The upper part of support 61 is joined to the edge portion of top plate 62 for rectification. The top plate 62 is provided, for example, 10 mm above wafer W such that it is opposed to the wafer W when wafer W is heated on the hot plate 41. Here, in order to form the unidirectional flow, top plate 62 may extend toward the near side up to a location at which gas discharged from discharging port 33 is directed. In this embodiment, the end portion of top plate 62 is provided to extend further than the above-noted location to the near side, whereby the top plate 62 reliably controls the flow of the purging gas discharged from discharge part 31 such that the gas can pass through between hot plate 41 and top plate 62 as a laminar flow. A heater 63 is buried at the end portion of top plate 62 on the near side. The heater 63 is connected to a power supply unit 64. The control unit controls the amount of power supply from power supply unit 64 to heater 63, so that the undersurface at the end portion of top plate 62 on the near side is controlled, for example, at a certain temperature by means of the heater 63. Such a configuration prevents the purging gas discharged from discharging part 31 from being cooled before reaching the vicinity of hot plate 41, thereby preventing wafer W from being heated at non-uniform temperatures.

The control unit included in the heating apparatus 2 will now be described. The control unit has a program storing unit formed, for example, of a computer. The program storing unit stores, for example, a software program incorporating instructions to carry out the actions of the heating apparatus, such as the processing on wafer W, the delivery of wafer W, the heating of wafer W, and the control of the gas flow. The program is then read out to the control unit, so that the control unit controls the actions of the semiconductor manufacturing apparatus. It is noted that the program is stored in the program storing unit in such a manner that it is stored in a recording medium such as a hard disk, a compact disk, or a magneto-optical disk.

Figure 6:
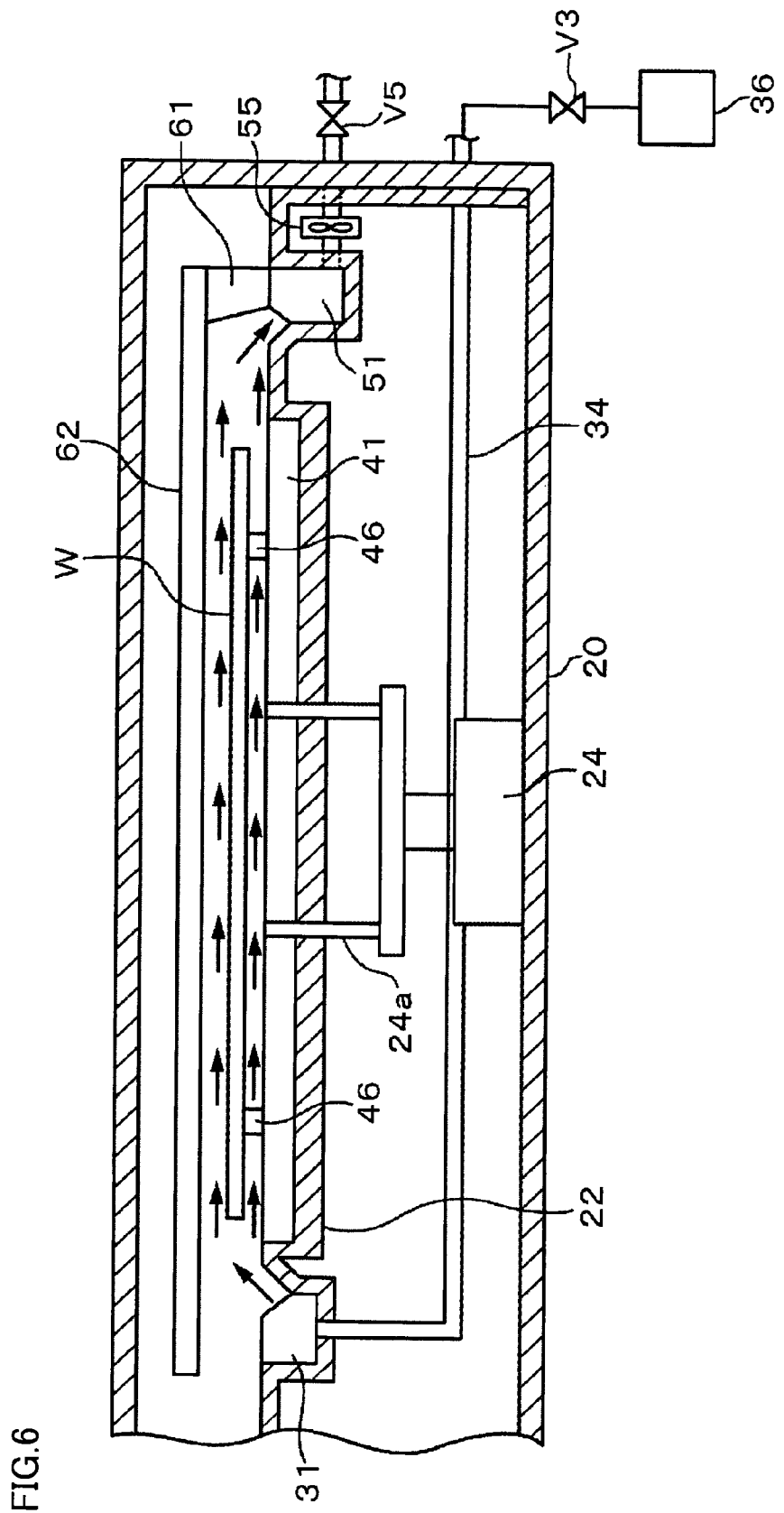
FIG. 6 is an illustration showing a unidirectional flow formed during heating by the heating apparatus.

The actions of the heating apparatus 2 will now be described with reference to FIG. 6. When wafer W having a resist liquid coated on the surface thereof is carried into housing 20 through transfer port 21 by means of a wafer W transferring mechanism, the wafer W is delivered to cooling plate 25 through supporting pin 23a. The surface of hot plate 41 is evenly heated, for example, at 130° C. by heaters 42a-42f before cooling plate 25 is moved above hot plate 41. The undersurface of the end portion of top plate 62 is also heated, for example, at 130° C. by heater 63.

Elevator mechanism 24 allows supporting pin 24a to go up to support the back surface of wafer W transferred over hot plate 41 by cooling plate 25. When cooling plate 25 retreats, elevator mechanism 24 allows supporting pin 24a to go down, so that wafer W is delivered onto protrusion portion 46 on hot plate 41. In other words, wafer W is supported in such a manner that it is isolated from hot plate 41.

When wafer W is supported on hot plate 41, valve V3 is opened to allow the purging gas to be supplied from gas supply source 36 to gas supply pipe 34. The purging gas is heated to approximately 100° C. at discharging part 31 and discharged from discharging port 33 to top plate 62. Approximately simultaneously when the purging gas starts being discharged from gas discharging port 33, valve V5 is opened and fan 55 rotates for exhaustion from exhaust part 51. Therefore, the discharged purging gas flows between top plate 62 and hot plate 41 from the near side to the far side as represented by the arrow in FIG. 6, passes around wafer W, and thereafter flows into exhaust part 51 to be removed to the outside of housing 20. In other words, a unidirectional flow is formed around wafer as represented by the arrow in the figure. During formation of the unidirectional flow, the heating value of heaters 42c-42e is controlled such that it is greater than the heating value of heaters 42a, 42b, 42f-42h, whereby the first region P1 of wafer W is heated at a temperature slightly higher than the second region P2. The resist liquid applied to wafer W is heated and dried by the heat from hot plate 41 and the unidirectional flow in this manner, so that a resist film is formed on wafer W.

After the purging gas is supplied to wafer W, for example, for a certain period of time, the supply of the purging gas from gas supply source 36 is stopped and the discharging of the purging gas from discharging part 31 is stopped. Approximately simultaneously when the purging gas stops being discharged, the exhaustion at exhaust part 51 also stops, and supporting pin 24a goes up with wafer W supported thereon. Cooling plate 25 moves above hot plate 41 again, so that wafer W is delivered onto cooling plate 25. The cooling plate 25 moves to the near side on base 22 while roughly removing the heat from wafer W. Thereafter, the wafer W is delivered to the transferring mechanism such as a transfer arm by means of support pin 23a and transferred to the outside of housing 20.

In heating apparatus 2 in the present embodiment, a gas flow is formed to flow between hot plate 41 and top plate 62 from the near side to the far side when wafer W coated with a resist liquid is placed on hot plate 41 for heating. In other words, a heating process is performed while a gas flow from the one end side to the other end side of wafer W is formed. Therefore, the gas staying around wafer W is reduced and variations in the velocity of flow at the surface of wafer W are reduced. Accordingly, the sublimation substances from the resist liquid are effectively exhausted from above wafer W, so that the attachment of particles to wafer W can be reduced. When so to speak a unidirectional gas flow is formed in this manner, the velocity of gas flow in the first region P1 of wafer W that is the exhaust part 51 side tends to increase. However, the heating at the first region P1 and the other region, that is, the second region P2 is controlled independently by independently controlling the heating values of a plurality of heaters 42a-42h buried in hot plate 41, so that the temperature at the first region P1 becomes higher than the temperature at the second region P2. The heating process is therefore performed on wafer W with good within-wafer uniformity.

Moreover, in the heating apparatus 2, wafer W is held in such a manner that it is isolated from hot plate 41 with protrusion portion 46 on the surface of hot plate 41 (in this example, the height of the protrusion portion is set at 0.3 mm), thereby preventing contact of the warped wafer W with hot plate 41. The misalignment of wafer W is thus prevented. The wafer W of 12 inches or larger, in particular, benefits this effect. Although the effect of the heat transfer from hot plate 41 to wafer W is slightly reduced because of isolation of wafer W from hot plate 41 in this manner, gas having the approximately same temperature as the wafer W heating temperature flows along the surface of wafer W, resulting in high uniformity of a within-wafer temperature for wafer W. The heating process can thus be performed with good within-wafer uniformity.

When the height of protrusion portion 46 on hot plate 41 is 0.1 mm, the heat transfer from hot plate 41 to wafer W is substantially not different from when wafer W is in contact with hot plate 41. With the height of protrusion portion 46 of 0.3 mm or higher, the wafer W heating temperature relies heavily on hot gas flowing above wafer W. Therefore, the temperature of the hot gas is desirably set at the same temperature as the wafer heating temperature, that is, the setting temperature in the heating process for wafer W. However, the perfect agreement is difficult, and a variation of ±2% is actually inevitable. Therefore, it is important that the temperature of the hot gas should be within ±2%.

In addition, since wafer W is isolated at a great distance, the slippage of delivered wafer W, which is often seen with the height of 0.1 mm of protrusion portion 46, is less likely to take place.

Figure 5B:
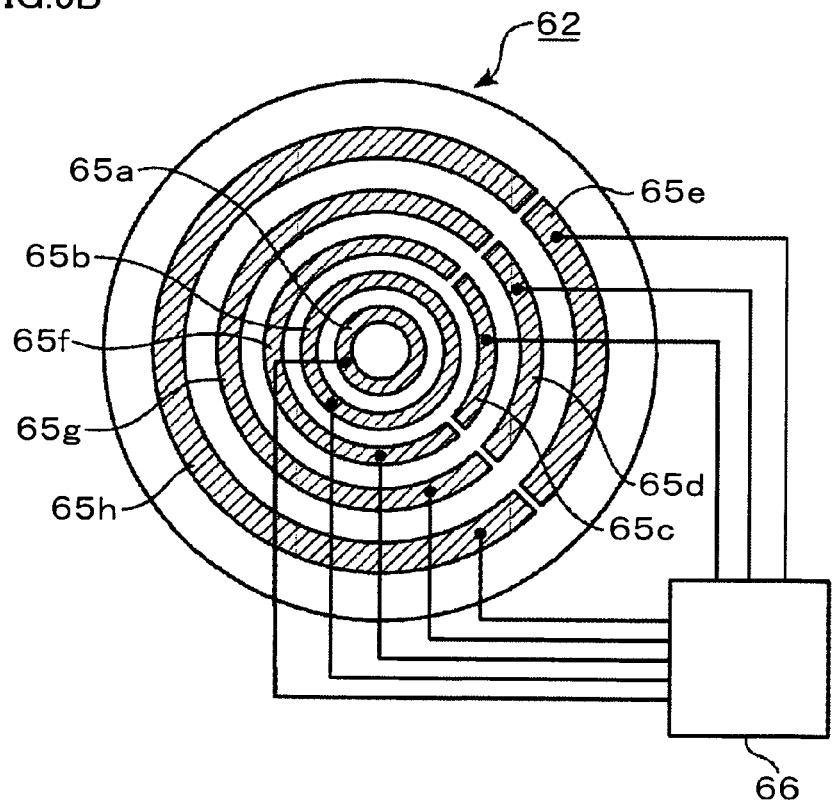
FIG. 5B is an illustration of a top plate forming a modification to the heating apparatus.

In the embodiment as described above, the first region P1 of wafer W is heated to a temperature higher than the second region P2 by independently controlling the heating values of heaters 42a-h of hot plate 41. Alternatively, heaters may be buried in the undersurface of top plate 62 such that the respective heating values are independently controlled at a region opposed to the first region P1 of wafer W and a region opposed to the second region P2, whereby the first region P1 of wafer W is heated to a temperature higher than the second region P2 by those heaters. In such a case, the temperature on the hot plate 41 side may continuously be uniform during heating of wafer W. Heaters 65a-65h are arranged in top plate 62 as shown in FIG. 5B in a manner similar to the heaters provided in hot plate 41. The heating values of heaters 65a-65h are individually controlled by the control unit through a power supply unit 66.

Figure 7:
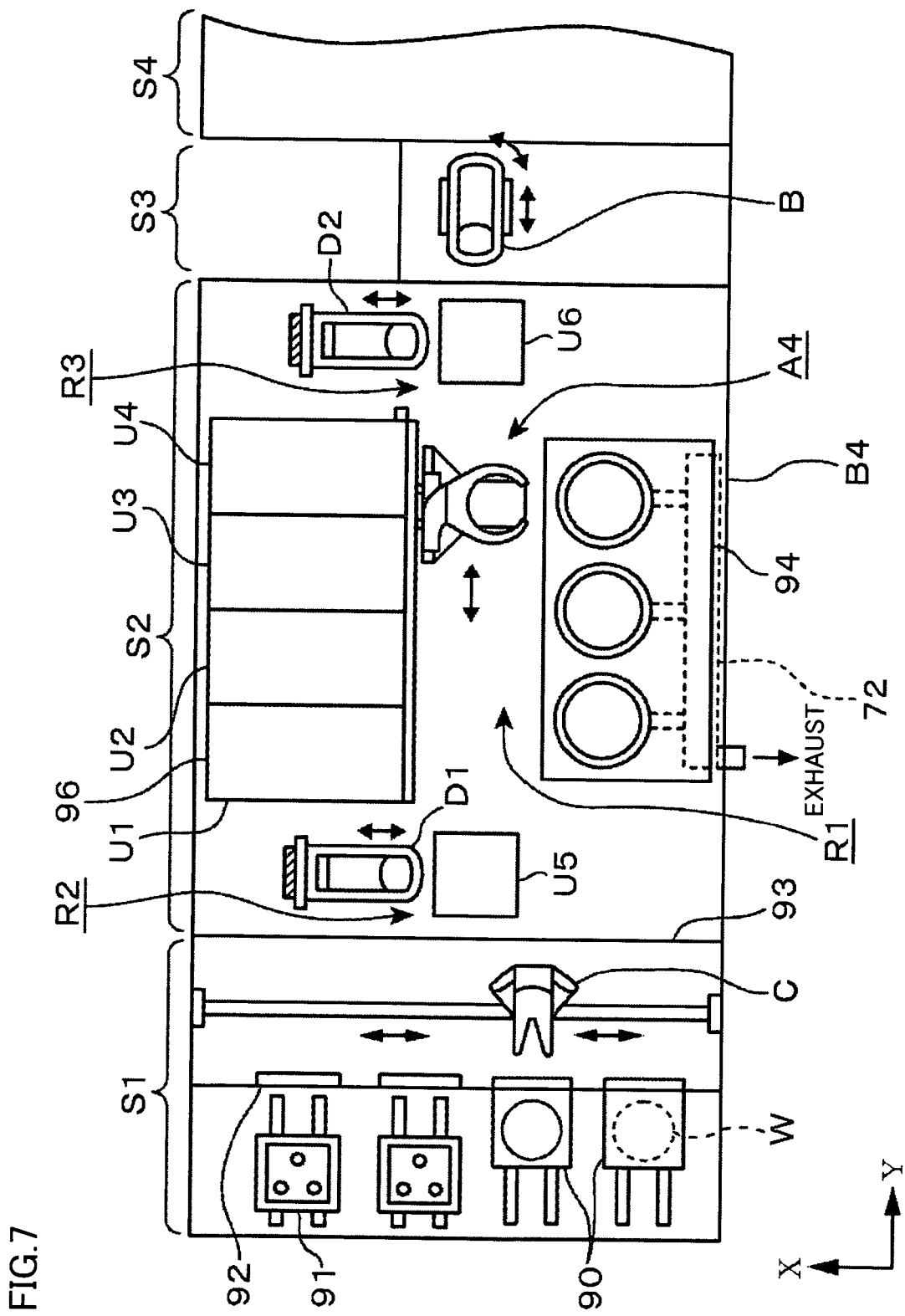
FIG. 7 is a plan view of a coating and development apparatus employing the heating apparatus.
Figure 8:
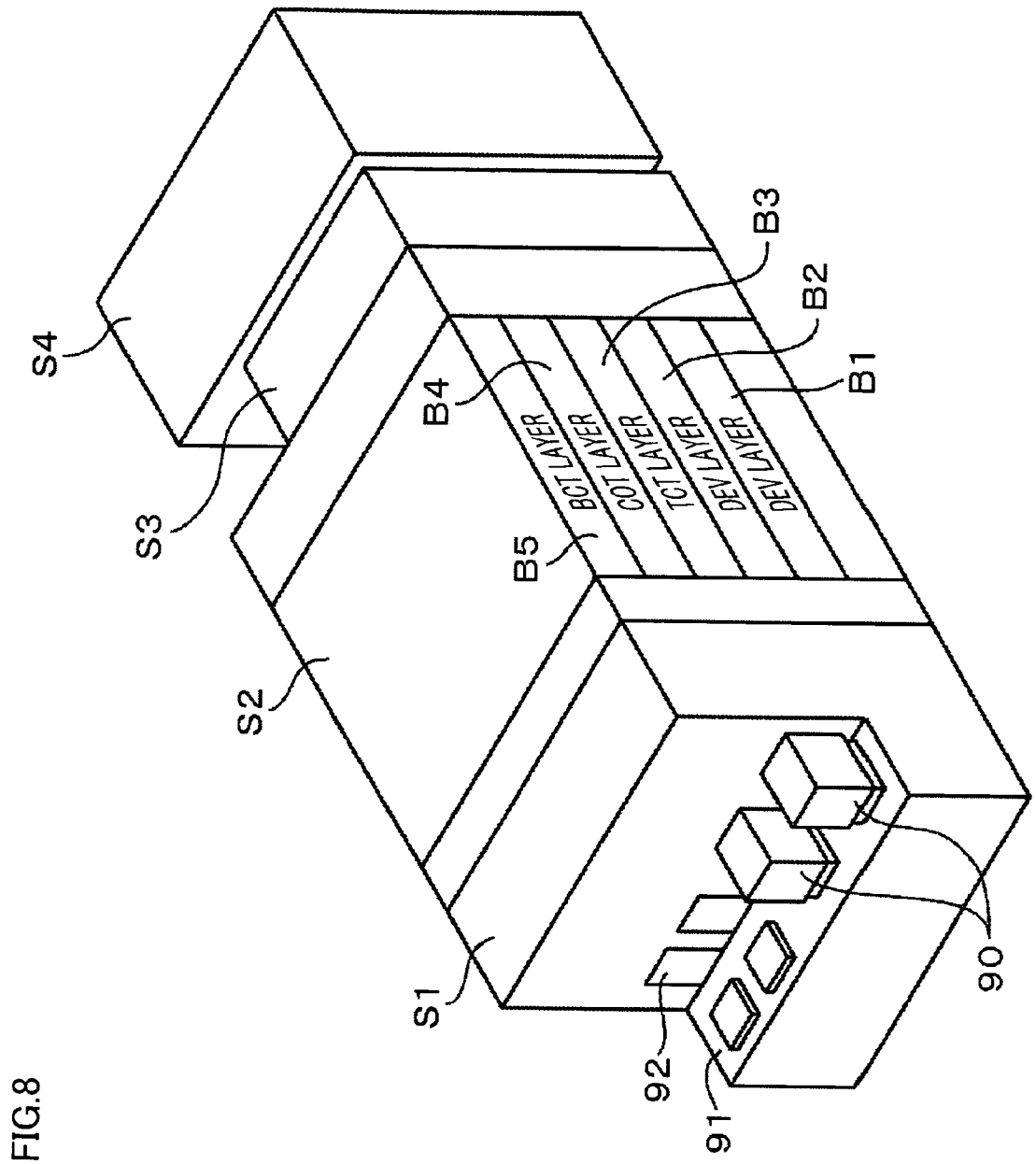
FIG. 8 is a perspective view showing the coating and development apparatus.
Figure 9:
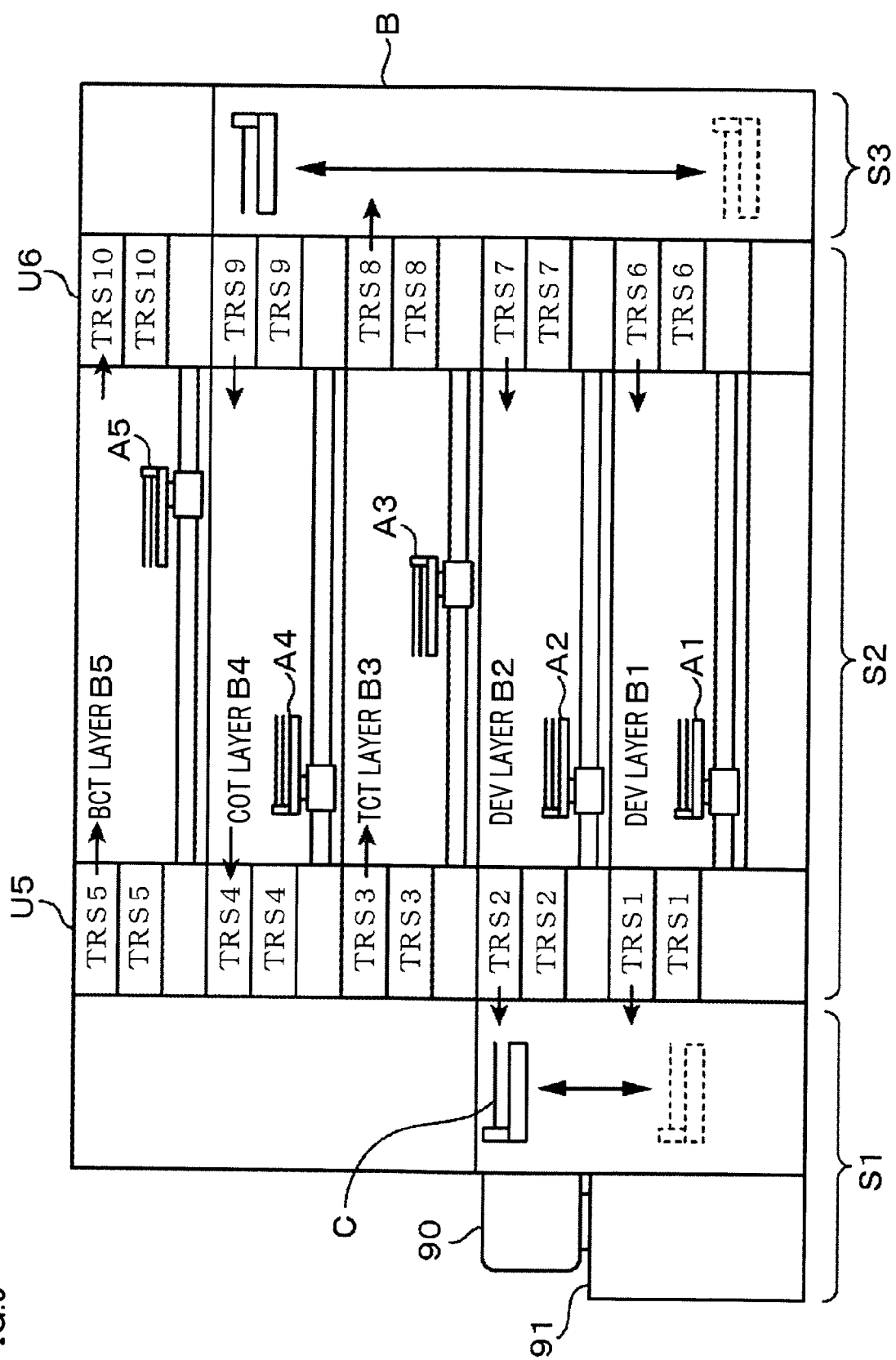
FIG. 9 is a side cross sectional view showing the coating and development apparatus.

An embodiment in which the heating apparatus 2 of the present invention is applied to a resist pattern forming apparatus as a coating and development apparatus will now be described. FIG. 7 is a plan view, FIG. 8 is a schematic perspective view, and FIG. 9 is a schematic side view of the resist pattern forming apparatus. This apparatus includes a carrier block S1 for carrying in/out a carrier 90 hermetically accommodating, for example, thirteen wafers W as substrates, a process block S2 including a plurality of, for example five, longitudinally arranged unit blocks B1-B5, an interface block S3, and an exposure apparatus S4.

The carrier block S1 is provided with a platform 91 on which a plurality of carriers 90 can be placed, an opening/closing part 92 provided on the wall surface ahead as viewed from platform 91, and a transfer arm C for removing wafer W from carrier 90 through opening/closing part 92. The transfer arm C is formed to freely move forward/backward and up/down, freely rotate around the vertical axis, and freely move in the direction in which carriers 90 are arranged so that wafer W is delivered to/from delivery stages TRS1 and TRS2 of unit blocks B1 and B2 described later.

On the far side of the carrier block S1, the process block S2 enclosed by a housing 93 is connected. The process block S2 includes, in this example, first and second unit blocks (DEV layers) B1, B2 for a development process, which are allotted to the lower two stages from the lower side, a third unit block (TCT layer) B3 for a process of forming an antireflection coating formed over a resist film, a fourth unit block (COT layer) B4 for a process of applying a resist liquid, and a fifth unit block (BCT layer) for a process of forming an antireflection coating formed under the resist film. Here, first and second unit blocks correspond to unit blocks for the development process, and third to fifth unit blocks correspond to unit blocks for the coating film forming process.

The configuration of the first to fifth unit blocks B (B1-B5) will now be described. Each of these unit blocks B1-B5 includes a liquid processing unit for applying chemicals to wafer W, a variety of heating/cooling system processing units for pretreatment and subsequent treatment before and after the processing at the liquid processing unit, and main arms A1-A5 as transfer means dedicated to the transfer of wafer W to/from the heating/cooling processing units of these blocks.

COT layer B4 shown in FIG. 7 will first be described by way of example. A transfer region R1 for wafer W is formed approximately at the center of the COT layer B4 in the lengthwise direction of COT layer B4 (in the Y-axis direction in the figure) for connecting carrier block S1 to interface block S3.

On either side of the transfer region R1 as viewed from the carrier block S1 side, a coating unit 94 including a plurality of coating parts for applying a resist to wafer W is provided on the right side from the near side (the carrier block S1 side) to the far side. On the left side of COT layer B4, four shelf units U1, U2, U3, U4 are provided in order from the near side to the far side by forming the heating/cooling system unit in multi-stages. A variety of units for pretreatment and subsequent treatment before and after the process performed at coating unit 94 are stacked in a plurality of stages, for example, in two stages.

A variety of units for pretreatment and subsequent treatment as described above include a cooling unit (COL) for adjusting wafer W at a prescribed temperature before application of a resist liquid, a heating unit (CHP) 95 called, for example, a pre-baking unit for performing a heating process on wafer W after application of a resist liquid, an edge exposure unit (WEE) for selectively exposing only the edge portion of wafer W, and the like. In this example, heating apparatus 2 illustrated with reference to FIGS. 1 to 6 corresponds to the heating unit 95. Those units such as the cooling unit (COL) and the heating unit (CHP) 95 are accommodated in their respective process containers 96. Each of shelf units U1-U4 is formed to have the process containers 96 stacked in two stages. A transfer port 97 through which wafer W is carried in/out is formed on that surface of each process container 96 which faces transfer region R1. In this example, heating units (CHP) 95 are stacked as shelf unit U3.

The transfer region R1 is provided with the main arm A4. The main arm A4 is formed to deliver wafers between all the modules (at which wafer W is placed) in the COT layer B4, for example, between each process unit of shelf units U1-U4, coating unit 94, shelf unit U5 described later, and shelf unit U6. Therefore, main arm A4 is formed to freely move forward/backward and up/down, freely rotate around the vertical axis, and freely move in the Y-axis direction.

That region of transfer region R1 which is adjacent to carrier block S1 is a first wafer delivery region R2. Shelf unit U5 is provided in this region R2 at a location that can be accessed by transfer arm C and main arm A4, as shown in FIGS. 7 and 9. In addition, a first delivery arm D1 is provided serving as a first substrate-delivering means for delivering wafer W to the shelf unit U5.

In this example, unit blocks B1-B5 each include one or more, for example two, first delivery stages TRS1-TRS5 so that the shelf unit U5 delivers wafer W to/from main arms A1-A5 of unit blocks B1-B5, as shown in FIG. 9. A first delivery stage group is thereby formed in which the first delivery stages are stacked in multi-stages. The first delivery arm D1 is formed to freely move forward/backward and up/down such that wafer W can be delivered to each of the first delivery stages TRS1-TRS5. The first delivery stages TRS1, TRS2 of the first and second unit blocks B1, B2 are formed to deliver wafer W to/from transfer arm C in this example and correspond to the delivery stages for the carrier blocks.

In addition, that region of transfer region R1 which is adjacent to interface block S3 is a second wafer delivery region R3. In this region R3, as shown in FIG. 9, shelf unit U6 is provided at a location that can be accessed by main arm A4.

A second delivery arm D2 is also provided serving as a second substrate delivering means for delivering wafer W to shelf unit U6.

In this example, unit blocks B1-B5 each include one or more, for example two, second delivery stages TRS6-TRS10 so that the shelf unit U6 delivers wafer W to/from main arms A1-A5 of unit blocks B1-B5, as shown in FIG. 9. A second delivery stage group is thereby formed in which the second delivery stages are stacked in multi-stages. The second delivery arm D2 is formed to freely move forward/backward and up/down such that wafer W is delivered to each of the second delivery stages TRS6-TRS10. In this manner, in the present embodiment, wafer W can be delivered freely between unit blocks B1-B5 stacked in five stages through the respective first delivery stages TRS1-TRS5 and the respective second delivery stages TRS6-TRS10 by means of the first delivery arm D1 and the second delivery arm D2.

The other unit blocks B will now be described briefly. DEV layers B1, B2 are similarly formed and each provided with a development unit including a plurality of development parts for performing a development process on wafer W. Shelf units U1-U4 include a heating unit (PEB) called a post exposure baking unit or the like for a heating process for the exposed wafer W, a cooling unit (COL) for adjusting wafer W at a prescribed temperature after the processing at the heating unit (PEB), and a heating unit (POST) called a post baking unit or the like for a heating process for eliminating the moisture from wafer W after the development process. Except for this point, DEV layers B1, B2 are formed similar to COT layer B4. It is noted that these heating units provided for DEV layers B1, B2 have the same configuration, for example, with heating unit 95 provided for COT layer B4, except for the process temperature and process time.

In these DEV layers B1, B2, wafer W is delivered by means of the respective main arms A1, A2 to the respective first delivery stages TRS1, TRS2, the respective second delivery stages TRS6, TRS7, the development unit, and each process unit of shelf units U1-U4.

TCT layer B3 is provided with a second antireflection coating forming unit including a plurality of second antireflection coating forming parts for performing a process of forming a second antireflection coating on wafer W. In other words, the second antireflection coating forming unit is an apparatus for applying chemicals for an antireflection coating to wafer W after a resist liquid is applied. A discharging port formed at a chemicals nozzle 12a discharges chemicals for antireflection coatings. Shelf units U1-U4 are formed similar to COT layer B4 except that they include a cooling unit (COL) for adjusting wafer W at a prescribed temperature before the antireflection coating forming process, and a heating unit for a heating process for wafer W after the antireflection coating forming process. It is noted that the heating unit (CHP) has the same configuration, for example, with heating unit 95 provided for COT layer B4, except for the process temperature and process time. In this TCT layer B3, wafer W is delivered by means of main arm A3 to the first delivery stage TRS3, the second delivery stage TRS8, the second antireflection coating forming unit, and each process unit of shelf units U1-U4.

BCT layer B5 is provided with a first antireflection coating forming unit including a plurality of first antireflection coating forming parts for performing a process of forming a first antireflection coating on wafer W. In other words, the first antireflection coating forming unit is an apparatus for applying chemicals for an antireflection coating to wafer W before a resist liquid is applied. A discharging port formed at a chemicals nozzle 12a discharges chemicals for antireflection coatings. Shelf units U1-U4 include a cooling unit (COL) for adjusting wafer W at a prescribed temperature before the antireflection coating forming process and a heating unit (CHP) for a heating process for wafer W after the antireflection coating forming process. Except that the edge exposure unit (WEE) is not included, BCT layer 5 is configured similar to COT layer B4. It is noted that the heating unit (CHP) has a the same configuration, for example, with heating unit 95 provided for COT layer B4, except for the process temperature and process time. In the fifth unit block B5, wafer W is delivered by means of main arm A5 to the first delivery stage TRS5, the second delivery stage TRS10, the first antireflection coating forming unit, and each process unit of shelf units U1-U4.

It is noted that those process units are not limited to a heating unit (CHP, PEB, POST), a cooling unit (COL), and an edge exposure unit (WEE). Alternatively, any other process unit may be provided. In the actual apparatus, the number of installed units are determined considering the process time for each unit.

On the other hand, exposure apparatus S4 is connected through interface block S3 on the far side of shelf unit U6 in process block S2. Interface block S3 includes an interface arm B for delivering wafer W to shelf unit U6 in process block S2 and exposure apparatus S4. The interface arm B serves as means for transferring wafer W located between process block S2 and exposure apparatus S4. In this example, interface arm B is formed to freely move forward/backward and up/down and freely rotate around the vertical axis such that wafer W is delivered to the second delivery stages TRS6-TRS9 of the first to fourth unit blocks B1-B4. In this example, the second delivery stages TRS6-TRS9 correspond to the delivery stages for the interface block.

Alternatively, the interface arm B may be formed to deliver wafer W to the second delivery stages TRS6-TRS10 of all the unit blocks B1-B5. In this case, the second delivery stages TRS6-TRS10 correspond to the delivery stages for the interface block.

Figure 10:
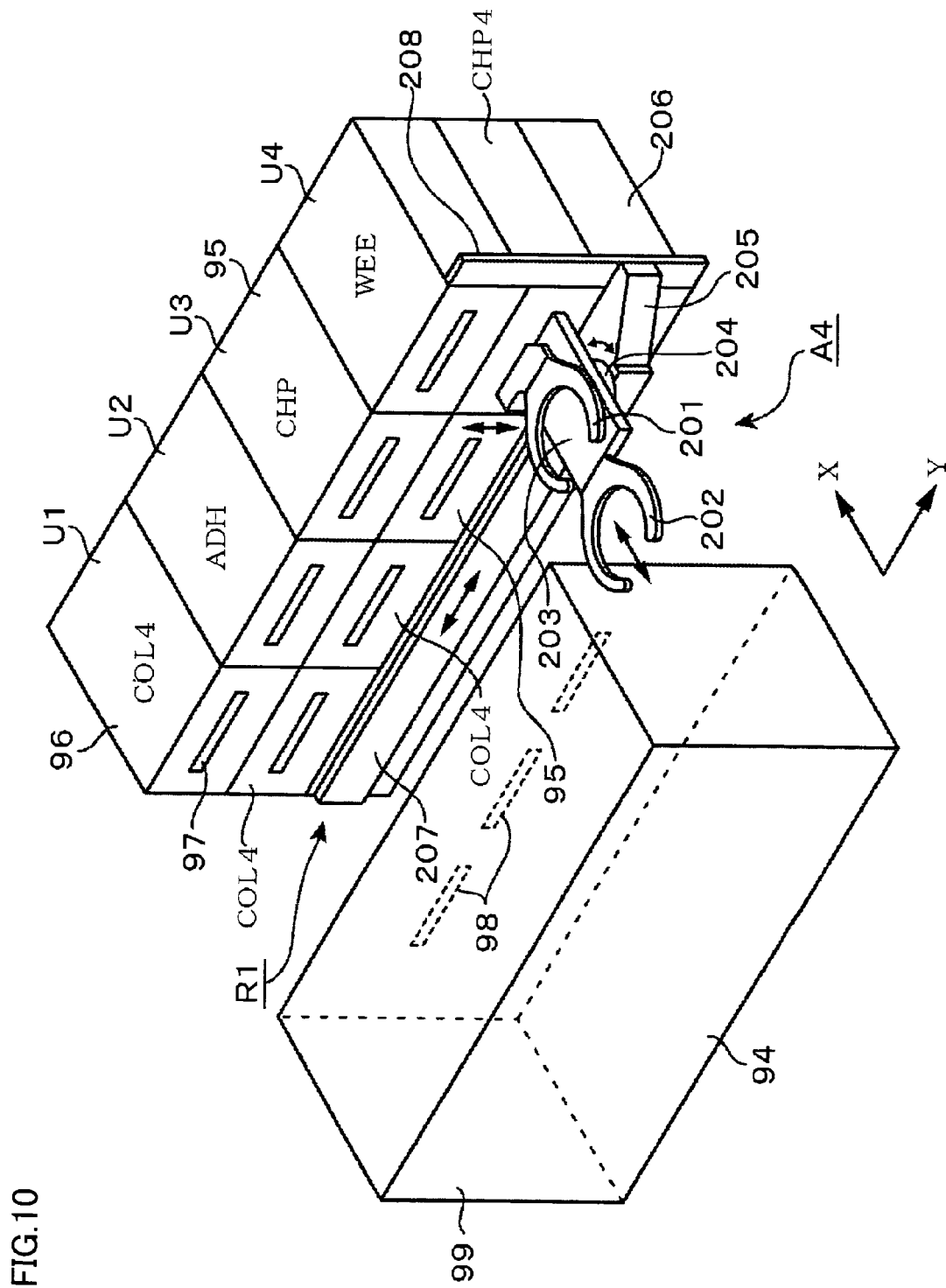
FIG. 10 is a perspective view showing a coating unit, a shelf unit, and transfer portion in the coating and development apparatus.

Main arm A (A1-A5) will now be described briefly, taking main arm A4 for COT layer as an example. As shown in FIG. 10, main arm A4 includes two arm bodies 201, 202 for supporting the peripheral region on the back side of wafer W. These arm bodies 201, 202 are formed to freely move forward and backward independently from each other along a base 203. The base 203 is formed to freely rotate around the vertical axis by means of a rotation mechanism 204. The base 203 is also formed to freely move in the Y-axis direction along a Y-axis rail 207 attached to that surface of a base portion 206 supporting shelf units U1-U4 which faces transfer region R1, and to freely move up and down along an elevator rail 208. In such a manner, arm bodies 201, 202 are formed to freely move forward/backward, freely move in the Y-axis direction, freely move up/down, and freely rotate around the vertical axis direction. Main arms A1-A3 and A5 are also formed similar to main arm A4. Main arm A allows wafer W to be delivered between each unit of shelf units U1-U6, the first and second delivery stages TRS1-TRS10, and the liquid processing unit.

In COT layer B4, wafer W is transferred into the heating unit through transfer port 97 by means of main arm A4, and after being coated with a resist liquid, wafer W is transferred to the outside of heating unit 95 through transfer port 97 by means of main arm A4.

The flow of wafer W in the resist pattern forming apparatus will be described where the respective antireflection coatings are formed over and under the resist film by way of example. First, carrier 90 is externally carried into carrier block S1. Wafer W is removed from inside the carrier 90 by transfer arm C. The wafer W is first delivered from transfer arm C to the first delivery stage TRS2 of shelf unit U5 of the second unit block B2. The wafer is then delivered to main arm A5 of BCT layer B5 through the first delivery part TRS5 by means of the first delivery arm D1 so that wafer W is delivered to BCT layer B5. Then, in BCT layer B5, the wafer is transferred by main arm A5 in the order of the cooling unit (COL)→the first antireflection coating forming unit→the heating unit (CHP) →the second delivery stage TRS10 of shelf unit U6, thereby forming the first antireflection coating.

Then, the wafer W at the second delivery stage TRS10 is transferred to the second delivery stage TRS9 by the second delivery arm D2 so that the wafer W is delivered to COT layer B4. The wafer is then delivered to main arm A4 of COT layer B4. Then, in COT layer B4, the wafer is transferred by main arm A4 in the order of the cooling unit (COL)→the coating unit→the heating unit (CHP)→the first delivery stage TRS4, thereby forming a resist film on the first antireflection coating.

Then, the wafer W at the delivery stage TRS4 is transferred by the first delivery arm D1 to the first delivery stage TRS3 so that the wafer W is delivered to TCT layer B3. The wafer W is then delivered to main arm A3 of the TCT layer B3. Then, in TCT layer B3, the wafer W is transferred by main arm A3 in the order of the cooling unit (COL)→the second antireflection coating forming unit→the heating unit (CHP)→the edge exposure unit (WEE)→the second delivery stage TRS8 of shelf unit U6, thereby forming the second antireflection coating on the resist film.

Then, the wafer at the second delivery stage TRS8 is transferred by interface arm B to exposure apparatus S4, where a prescribed exposure process is performed. After the exposure process, the wafer W is transferred to the second delivery stage TRS6 (TRS7) of shelf unit U6 by means of interface arm B so that wafer W is delivered to DEV layer B1 (DEV layer B2). The wafer W at the stage TRS6(TRS7) is received by main arm A1 (main arm A2) of DEV layer B1 (DEV layer B2). In the DEV layer B1 (B2), the wafer W is first transferred in the order of the heating unit (PEB)→the cooling unit (COL)→the development unit→the heating unit (POST) for a prescribed development process. The wafer W thus subjected to the development process is transferred to the first delivery stage TRS1 (TRS2) so that wafer W is delivered to transfer arm C. The wafer is then returned by transfer arm C to the original carrier 90 placed in carrier block S1.

By adopting the heating apparatus in accordance with the present invention as a heating unit provided in a resist pattern forming apparatus as a coating and development apparatus, in each block B3-B5 for forming a coating film, the wafer W coated with a resist liquid or chemicals for an antireflection coating as a coating liquid can be controlled in such a manner that the first region P1 and the second region P2 are independently heated while the so-called unidirectional flow is formed as described above. Therefore, the heating process can be performed on wafer W with good within-wafer uniformity, so that a good resist pattern can be formed on the wafer W.

It is noted that heating apparatus 2 may also be applied, in place of the coating and development apparatus for forming a resist film on a substrate, to an insulating film forming apparatus for forming an insulating film on a substrate by applying the precursor of the insulating film, for example, a liquid to the substrate and heating the liquid.

(Evaluation Test 1)

The heating apparatus 2 as described above was used to perform a heating process on wafer W coated with no coating liquid on the surface thereof. The distribution of the mean velocity of flow and the distribution of amplitude (the mean value of changing wind speed per unit time) on the surface of wafer W were determined. It is noted that the height of protrusion portion 46 was set at 0.3 mm and the wafer W heating temperature was set at 140° C. In the Evaluation Test 1, wafer W was heated without an offset, that is, without any difference in heating value among heaters 42a-42h of hot plate 41. Furthermore, the temperature of the unidirectional flow fed for wafer W was set at 140° C. and the flow rate of the unidirectional flow was set at 5 L/min.

(Evaluation Test 2)

Figure 13:
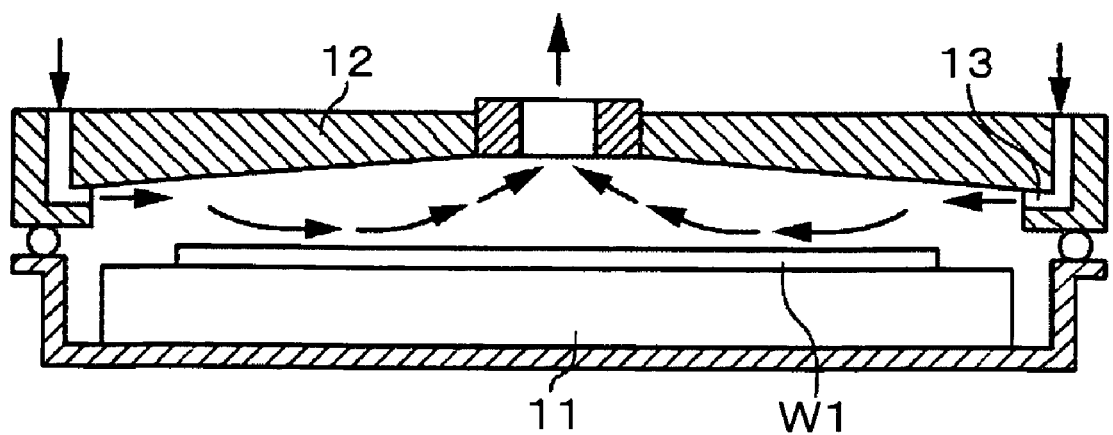
FIG. 13 is a view showing an example of a conventional heating apparatus.

In Evaluation Test 2, a conventional heating apparatus as shown in FIG. 13 was used, where gas was supplied from a gas supply port 12 formed around the entire circumference of wafer W while the gas was sucked and exhausted from the central portion of a cover body 13 lying over a hot plate 11, thereby forming a gas flow from the outer circumference to the central portion of wafer W. A heating process was performed on wafer W coated with no coating liquid on the surface thereof. The temperature of heating wafer W by hot plate 11 and the temperature of the gas flow were set at 140° C., and the flow rate of the gas flow was set at 3 L/min.

Figure 11B:
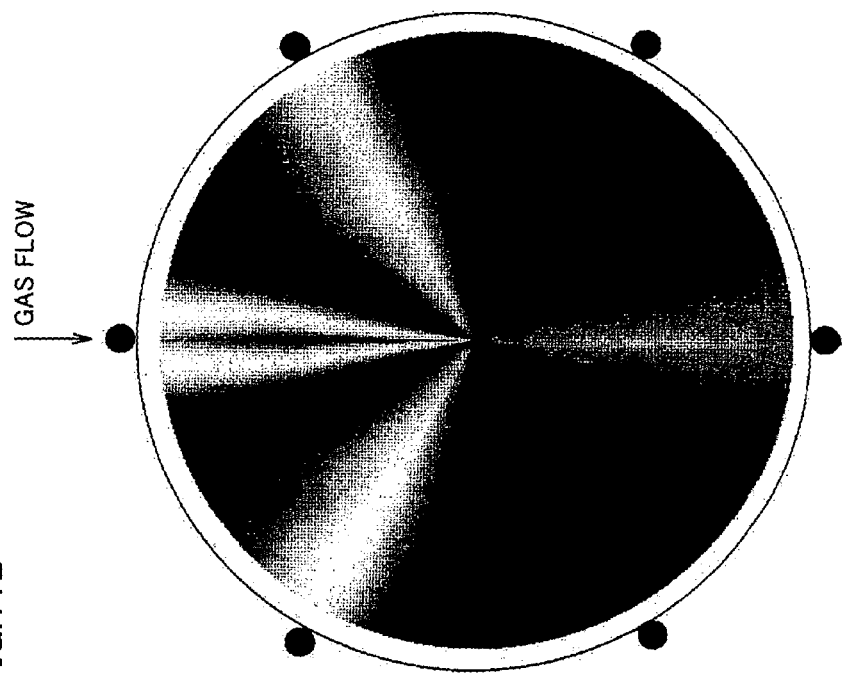
FIGS. 11A and 11B are illustrations representing the velocity of flow around a wafer heated by the heating apparatus.
Figure 11A:
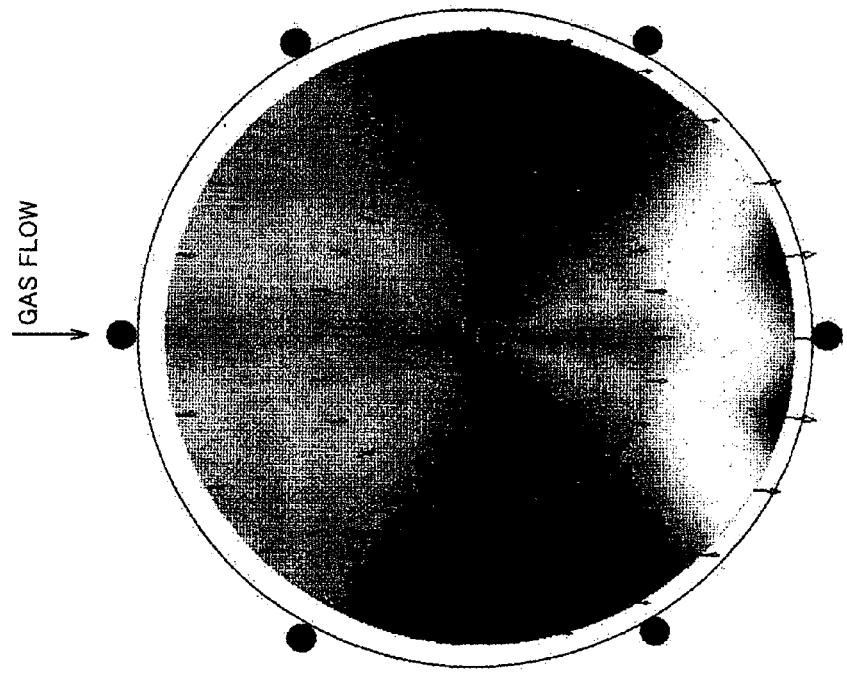

FIG. 11A shows the result of Evaluation Test 1. The distribution cannot be illustrated finely since the originally colored illustration is converted into a monochrome image. It can be understood, however, that the velocity of the gas flow in the region corresponding to the first region P1 in FIG. 4 is higher than the velocity of the gas flow in the second region P2. Therefore, the heating value that is reduced in the first region P1 because of the unidirectional flow is greater than the heating value that is reduced in the second region P2. It can be said that the first region P1 is effectively heated at a temperature higher than the second region P2 in order to improve the within-wafer uniformity of the wafer W. As shown in FIG. 11B, the distribution of amplitude is not varied greatly in Evaluation Test 1.

Without the unidirectional flow, the natural convection of the air is created by the heat from heater 42 inside housing 20 of heating apparatus 2. It is expected that the wind speed in each part on the surface of wafer W is unstable due to the natural convection and the temperature at each part on the surface of wafer W is also unstable. In Evaluation Test 1, it can be understood based on the distribution of amplitude that the variations in wind speed are reduced. Therefore, the effect of the natural convection is cancelled by feeding the unidirectional flow, so that the wind speed and the temperature at each part of wafer W may be stabilized, thereby preventing reduction in the within-surface uniformity of wafer W.

Figure 12B:
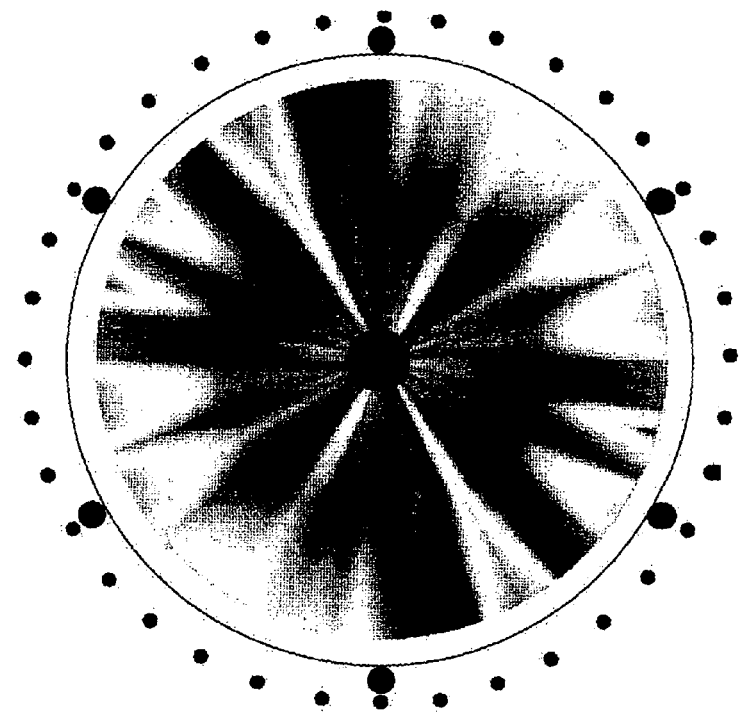
FIGS. 12A and 12B are illustrations representing the velocity of flow around a wafer heated by a conventional heating apparatus.
Figure 12A:
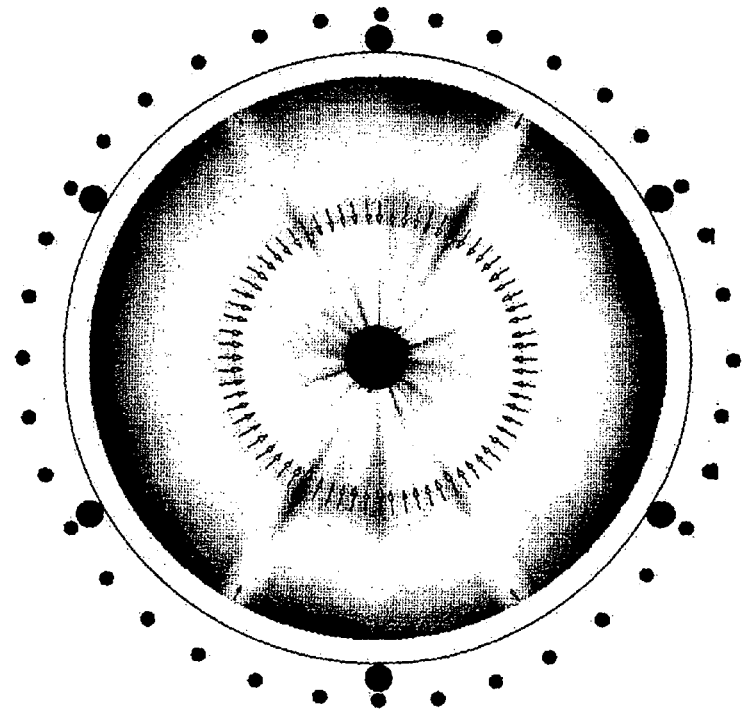

On the other hand, in Evaluation Test 2, as shown in FIG. 12A, the velocity of flow in the vicinity of the central portion of wafer W was slower than that of the outer portion, which suggests that the temperature in the vicinity of the central portion becomes higher. Moreover, as shown in FIG. 12B, the distribution of amplitude differs for each part on the surface of wafer W, and the distribution range was greater than the distribution range in Evaluation Test 1. By comparison between the distribution of amplitude in Evaluation Test 1 and the distribution of amplitude in Evaluation Test 2, the variations of the velocity of flow around wafer W can be reduced by feeding an unidirectional flow when a heating process is performed on wafer W.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A heating apparatus performing a heating process for a coating liquid coated on a substrate, comprising:
   a hot plate at which said substrate is placed;
   a top plate for rectification provided above said hot plate to be opposed to said substrate;
   a protruding portion provided on said hot plate for supporting said substrate in such a manner that said substrate is isolated from an upper surface of said hot plate;
   a gas discharging part provided on one end side of said hot plate, said gas discharging part having an input for receiving heated gas therein, and a plurality of gas discharging ports that are located below said upper surface of said hot plate for discharging heated gas between said hot plate and said top plate to form a gas flow having a width that can cover a width of said substrate;
   an exhaust part provided on a side opposed to said gas discharging part with said hot plate interposed, said exhaust part having exhaust ports also located below said upper surface of said hot plate to suck and exhaust said gas; and
   a heating part provided at said hot plate and being capable of independently heating a first region in said substrate, which is adjacent to said exhaust part, and a second region in said substrate, which is located at the side of said gas discharging part with respect to said first region, and heating said first region at a temperature higher than said second region,
   wherein said gas flow from said gas discharging ports of said gas discharging part to said exhaust ports is between said substrate and said top plate, and between said substrate and said hot plate.

2. The heating apparatus according to claim 1, wherein said protruding portion has a height of 0.3 mm to 1.0 mm, and
said gas discharged from said gas discharging port is heated at a temperature within ±2% with respect to a heating temperature for said substrate.

3. The heating apparatus according to claim 2, wherein said substrate is a semiconductor wafer having a size of at least 12 inches.

4. The heating apparatus according to claim 1, wherein said top plate is provided with another heating part for heating an undersurface of said top plate.

5. A coating and development apparatus comprising:
   a carrier block into which a carrier accommodating a substrate is carried;
   a process block including a coating part coating a resist on a surface of the substrate removed from said carrier, a heating apparatus heating the substrate coated with a resist, a cooling part cooling the heated substrate, and a development processing part developing the substrate after exposure; and
   an interface part delivering the substrate between said process block and an exposure apparatus, wherein
   the heating apparatus according to claim 1 is used as said heating apparatus.

6. A heating apparatus performing a heating process for a coating liquid coated on a substrate, comprising:
   a hot plate at which said substrate is placed;
   a top plate for rectification provided above said hot plate to be opposed to said substrate;
   a protruding portion provided on said hot plate for supporting said substrate in such a manner that said substrate is isolated from a surface of said hot plate;
   a gas discharging part provided on one end side of said hot plate, said gas discharging part having an input for receiving heated gas therein, and a plurality of gas discharging ports that are located below said upper surface of said hot plate for discharging heated gas between said hot plate and said top plate to form a gas flow having a width that can cover a width of said substrate;

an exhaust part provided on a side opposed to said gas discharging part with said hot plate interposed, said exhaust part having exhaust ports also located below said upper surface of said hot plate to suck and exhaust said gas; and a heating part provided at said top plate and being capable of independently heating a region opposed to a first region in said substrate, which is adjacent to said exhaust part, and a region opposed to a second region in said substrate, which is located at the side of said gas discharging part with respect to said first region, and heating said region opposed to said first region at a temperature higher than said region opposed to said second region, wherein said gas flow from said gas discharging ports of said gas discharging part to said exhaust ports is between said substrate and said top plate, and between said substrate and said hot plate.

7. A coating and development apparatus comprising:

a carrier block into which a carrier accommodating a substrate is carried;

a process block including a coating part coating a resist on a surface of the substrate removed from said carrier, a heating apparatus heating the substrate coated with a resist, a cooling part cooling the heated substrate, and a development processing part developing the substrate after exposure; and an interface part delivering the substrate between said process block and an exposure apparatus, wherein the heating apparatus according to claim 6 is used as said heating apparatus.

* * * * *